United States Patent
Leyh et al.

(10) Patent No.: US 9,391,592 B2
(45) Date of Patent: Jul. 12, 2016

(54) METHODS AND SYSTEMS FOR DYNAMICALLY ADJUSTING FREQUENCY OFFSETS FOR MITIGATING INTERFERENCE

(71) Applicant: MOTOROLA SOLUTIONS, INC, Schaumburg, IL (US)

(72) Inventors: Arthur Christopher Leyh, Spring Grove, IL (US); Thomas B Bohn, Mc Henry, IL (US); Gregory J Buchwald, Crystal Lake, IL (US); David P Gurney, Carpentersville, IL (US)

(73) Assignee: MOTOROLA SOLUTIONS, INC., Schaumburg, IL (US)

( * ) Notice: Subject to any disclaimer, the term of this patent is extended or adjusted under 35 U.S.C. 154(b) by 0 days.

(21) Appl. No.: 14/562,055

(22) Filed: Dec. 5, 2014

(65) Prior Publication Data

US 2016/0164496 A1   Jun. 9, 2016

(51) Int. Cl.
*H04B 7/00* (2006.01)
*H03J 7/02* (2006.01)
*H04B 7/185* (2006.01)

(52) U.S. Cl.
CPC .............. *H03J 7/02* (2013.01); *H04B 7/18506* (2013.01)

(58) Field of Classification Search
USPC ............. 455/452.1, 524, 522, 196.1, 131, 14, 455/67.11, 266, 71, 13.2, 436, 70; 370/336, 370/201, 337, 329, 331, 342, 324, 344, 370/311; 375/374, 326, 343, 340, 272, 132, 375/285
See application file for complete search history.

(56) References Cited

U.S. PATENT DOCUMENTS

| | | | |
|---|---|---|---|
| 5,491,837 A * | 2/1996 | Haartsen | H04W 52/242 370/337 |
| 7,418,269 B2 | 8/2008 | Edwards | |
| 8,543,065 B2 | 9/2013 | Karpoor et al. | |
| 8,611,823 B2 | 12/2013 | Weng et al. | |
| 2004/0152434 A1* | 8/2004 | Peterson, III | H03J 1/0075 455/196.1 |
| 2004/0157561 A1 | 8/2004 | Akerberg | |
| 2010/0208717 A1* | 8/2010 | Kim | H04W 16/14 370/342 |
| 2012/0135777 A1* | 5/2012 | Karpoor | H04W 52/40 455/522 |
| 2012/0270594 A1* | 10/2012 | Parkvall | H04W 56/0035 455/524 |
| 2013/0053103 A1 | 2/2013 | Kim et al. | |
| 2013/0324143 A1* | 12/2013 | Yokomakura | H04L 5/0005 455/452.1 |
| 2015/0181546 A1* | 6/2015 | Freda | H04W 56/0015 370/336 |

FOREIGN PATENT DOCUMENTS

WO   2014129978 A1   8/2014

* cited by examiner

*Primary Examiner* — Ganiyu A Hanidu (57) ABSTRACT

Disclosed herein are methods and systems for dynamically adjusting frequency offsets for mitigating interference. One embodiment takes the form of a process carried out by a mobile radio configured to use an adjustable transmit frequency. The mobile radio estimates an expected base-station-receive power level with respect to transmissions from to a base station. The mobile radio adjusts the transmit frequency to be a center frequency of a radio channel plus a default frequency offset responsive to the estimated expected base-station-receive power level being less than a first threshold. The mobile radio adjusts the transmit frequency to be the center frequency plus a modified frequency offset responsive to the estimated expected base-station-receive power level being greater than a second threshold. The modified frequency offset is greater in magnitude than the default frequency offset. The mobile radio transmits an uplink signal to the base station over the adjusted transmit frequency.

18 Claims, 8 Drawing Sheets

METHODS AND SYSTEMS FOR DYNAMICALLY ADJUSTING FREQUENCY OFFSETS FOR MITIGATING INTERFERENCE

BACKGROUND OF THE INVENTION

The available spectrum for two-way mobile radio systems is limited in today's regulatory environment. Spectrum re-allocations, re-banding, and re-purposing are becoming significantly more common in several radio frequency (RF) bands. Cellular carrier spectrum use (due, at least in part, to the smartphone revolution) is consuming large quantities of spectrum, leaving relatively less spectrum available for two-way mobile radio uses. This reduction in available Land Mobile Radio (LMR) spectral resources and spectrum use will most likely continue to increase in the future (due to ongoing severe spectrum shortages), and will challenge both two-way mobile radio users and manufacturers.

Engineering solutions that improve the spectral efficiency of two-way mobile radio channels are considered valuable to both regulators and network operators. Indeed, it often occurs that regulators pressure LMR-equipment manufacturers to either improve spectrum-utilization efficiency or risk losing allocated spectrum. Increased spectral efficiency also helps to improve both voice capacity and effective data-transfer rates in LMR systems, which among other advances could help to extend the useful life of such systems, and could provide moderate-rate data services in areas where broadband access is unavailable, potentially extending the markets for LMR equipment. Accordingly, for these reasons and others, there is a need for methods and systems for dynamically adjusting frequency offsets for mitigating interference.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

Disclosed herein are methods and systems for dynamically adjusting frequency offsets for mitigating interference. One embodiment takes the form of a process carried out by a mobile radio that is configured to use an adjustable transmit frequency. The process includes estimating an expected base-station-receive power level with respect to transmissions from the mobile radio to a base station. The process also includes adjusting the transmit frequency to be a center frequency of a radio channel plus a default frequency offset responsive to the estimated expected base-station-receive power level being less than a first threshold. The process also includes adjusting the transmit frequency to be the center frequency plus a modified frequency offset responsive to the estimated expected base-station-receive power level being greater than a second threshold, the modified frequency offset being greater in magnitude than the default frequency offset. The process also includes transmitting an uplink signal to the base station over the adjusted transmit frequency.

Another embodiment takes the form of a system that includes a communication interface, a processor, and data storage containing instructions executable by the processor for causing the system to carry out at least the functions described in the preceding paragraph.

Moreover, any of the variations and permutations described in the ensuing paragraphs and anywhere else in this disclosure can be implemented with respect to any embodiments, including with respect to any method embodiments and with respect to any system embodiments. Furthermore, this flexibility and cross-applicability of embodiments is present in spite of the use of slightly different language (e.g., process, method, steps, functions, set of functions, and the like) to describe and or characterize such embodiments.

In at least one embodiment, the radio channel is a shared radio channel. In at least one such embodiment, the shared radio channel is a 25-kHz-wide channel; in at least one such embodiment, the default frequency offset has a magnitude of 6.25 kHz.

In at least one embodiment, the default frequency offset has a magnitude of zero.

In at least one embodiment, the modified frequency offset has a magnitude that exceeds the magnitude of the default frequency offset by 1.4 kHz.

In at least one embodiment, the process further includes selecting the magnitude of the modified frequency offset based at least in part on the estimated expected base-station-receive power level. In at least one such embodiment, the selected magnitude of the modified frequency offset is one of two predetermined values, which correspond to respective ranges of estimated expected base-station-receive power levels.

In at least one embodiment, the mobile radio further includes a user interface and the process further includes receiving, via the user interface, one or both of the magnitude of the default frequency offset and a signum (i.e., "+1" or "−1") of the default frequency offset.

In at least one embodiment, the process further includes receiving, from the base station, one or both of the magnitude of the default frequency offset and a signum of the default frequency offset. In at least one such embodiment, receiving from the base station includes receiving via a control channel.

In at least one embodiment, the default frequency offset and the modified frequency offset have values that either are both positive or are both negative.

In at least one embodiment, estimating the expected base-station-receive power level includes receiving an indication of the expected base-station-receive power level from the base station. In at least one such embodiment, the indication of the expected base-station-receive power level is a base-station-measured received signal strength indicator (RSSI) of an earlier uplink signal previously received by the base station from the mobile radio.

In at least one embodiment, the process further includes receiving a downlink signal from the base station and determining a mobile-radio-received power level of the received downlink signal. In at least one such embodiment, the mobile radio estimates the expected base-station-receive power level based at least in part on the determined mobile-radio-received power level of the received downlink signal. In at least one further embodiment, the mobile radio determines the mobile-radio-received power level of the received downlink signal at least in part by measuring an RSSI of the received downlink signal.

In at least one embodiment, the mobile radio estimates the expected base-station-receive power level based at least in part on a comparative relationship between respective transmit powers of the base station and the mobile radio.

In at least one embodiment, the mobile radio estimates the expected base-station-receive power level based at least in part on a comparative relationship between respective transmit frequencies of the base station and the mobile radio.

In at least one embodiment, the mobile radio estimates the expected base-station-receive power level based at least in part on a comparative relationship between respective locations of the base station and the mobile radio. In at least one such embodiment, one or both of the location of the base station and the location of the mobile radio is determined using one or more of a satellite-based geo-positioning system (e.g., GPS, GLONASS, Galileo Positioning System, Beidou Navigation System, and the like) a wireless-network infrastructure user-equipment-location prediction, and an active Wi-Fi connection and a list of in-range Wi-Fi signals.

Before proceeding with this detailed description, it is noted that the entities, connections, arrangements, and the like that are depicted in—and described in connection with—the various figures are presented by way of example and not by way of limitation. As such, any and all statements or other indications as to what a particular figure "depicts," what a particular element or entity in a particular figure "is" or "has," and any and all similar statements—that may in isolation and out of context be read as absolute and therefore limiting—can only properly be read as being constructively preceded by a clause such as "In at least one embodiment, . . . ." And it is for reasons akin to brevity and clarity of presentation that this implied leading clause is not repeated ad nauseum in this detailed description.

Figure 1:
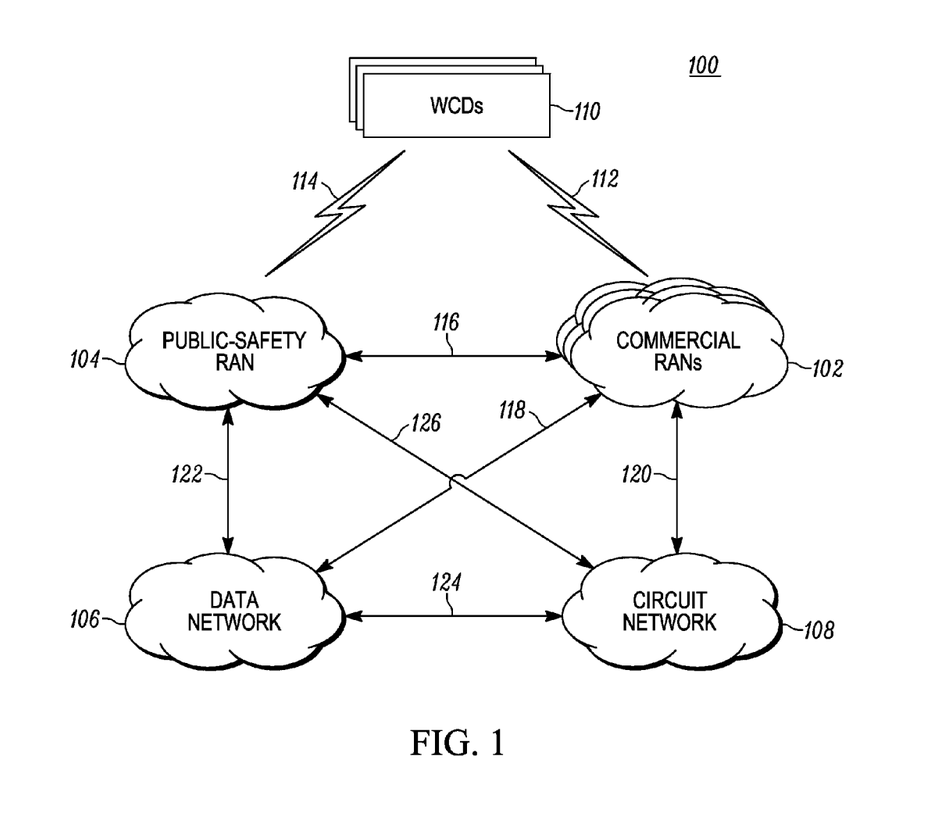
FIG. 1 depicts an example communication system, in accordance with at least one embodiment.
Figure 2:
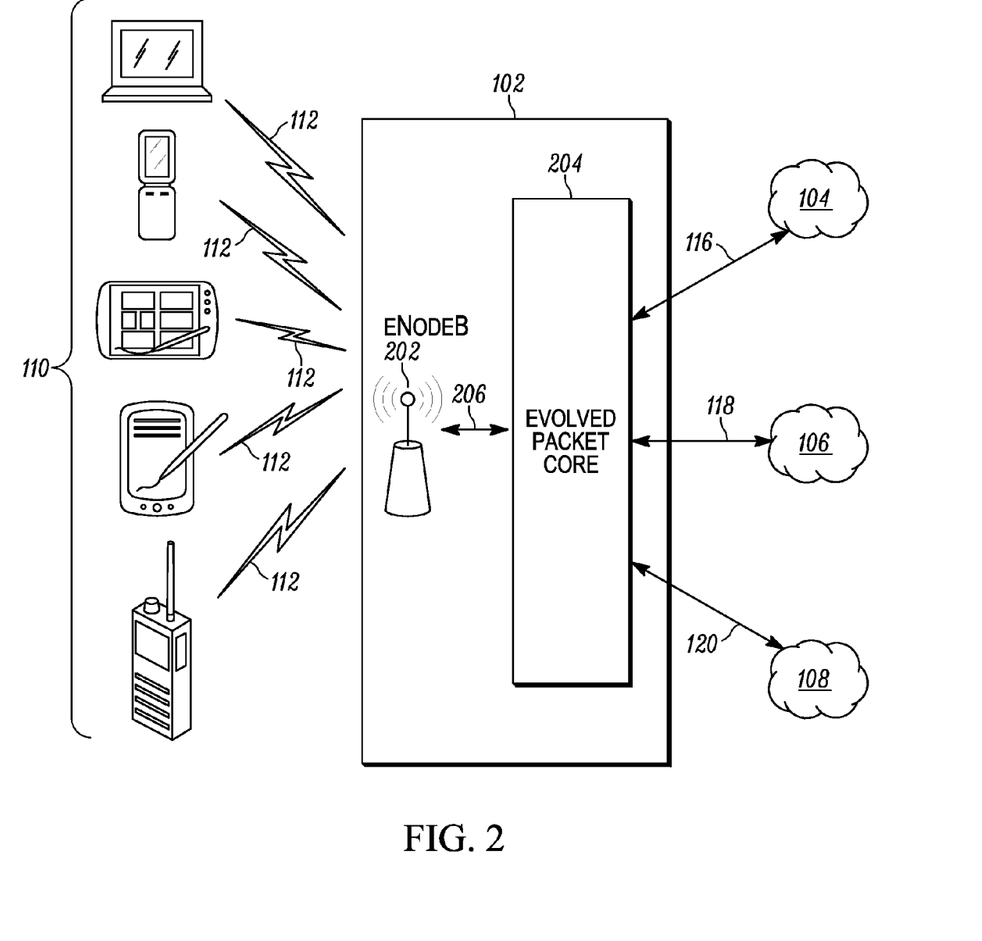
FIG. 2 depicts a further example of aspects of the communication system of FIG. 1, in accordance with at least one embodiment.

The following portion of this disclosure includes descriptions of FIGS. 1 and 2, which in general depict a communication system in which mobile radios communicate via one or more radio access networks (RANs). It is explicitly noted that mobile radios that communicate via one or more RANs may also be capable of communicating directly with one another. This is often termed direct mode, direct-mode communication, direct-mode operation (DMO), and the like. Thus, mobile radios that are capable of both direct-mode and RAN-based communication could carry out and embody the present methods and systems. Other common examples of RANs are wide area networks (WANs) and local area networks (LANs). LMR systems are often WANs, but can also operate over smaller areas.

FIG. 1 depicts an example communication system, in accordance with at least one embodiment. In particular, FIG. 1 depicts a communication system 100 that includes one or more commercial RANs 102, a public-safety RAN 104, a data network 106, a circuit network 108, wireless-communication devices (WCDs) 110 or user equipment, and communication links 112-126. In LMR networks, user equipment (or subscriber units) may include portable radios or mobile radios. In general, in at least one embodiment, each RAN 102 and the public-safety RAN 104 includes typical RAN elements such as base stations, base station controllers (BSCs), routers, switches, and the like, arranged, connected, and programmed to provide wireless service to user equipment (e.g., WCDs 110) in a manner known to those of skill in the relevant art. RAN equipment may also include repeaters (mobile or otherwise), in addition to base stations. In general, public-safety RAN equipment may utilize Project 25 (P25), Terrestrial Trunked Radio (TETRA), Digital Mobile Radio (DMR), and/or one or more wireless-communication types, standards, protocols, and the like.

The public-safety RAN 104 may include one or more packet-switched networks and/or one or more circuit-switched networks, and in general functions to provide one or more public-safety agencies with any necessary computing and communication needs. Thus, the public-safety RAN 104 may include a dispatch center communicatively connected with the data network 106 and also with the circuit network 108, for retrieving and transmitting any necessary public-safety-related data and communications. The public-safety RAN 104 may also include any necessary computing, data-storage, and data-presentation resources utilized by public-safety personnel in carrying out their public-safety functions. Moreover, the public-safety RAN 104 may include one or more network access servers (NASs), gateways, and the like for bridging communications to one or more other entities and/or networks, such as the commercial RANs 102, the data network 106, and the circuit network 108, as representative examples.

The data network 106 may be, include, or be a part of the global network of networks typically referred to as the Internet. The data network 106 may be a packet-switched network, and entities (i.e., servers, routers, computers, and the like) that communicate over the data network 106 may be identified by a network address such as an Internet Protocol (IP) address. Moreover, the data network 106 may include one or more NASs, gateways, and the like for bridging communications to one or more other entities and/or networks, such as the commercial RANs 102, the public-safety RAN 104, and the circuit network 108, as representative examples.

The circuit network 108 may be, include, or be a part of the circuit-switched telephone network commonly referred to as the public switched telephone network (PSTN), and in general functions to provide circuit-switched communications to various communication entities as is known in the relevant art. Moreover, the circuit network 108 may include one or more NASs, gateways, and the like for bridging communications to one or more other entities and/or networks, such as the commercial RANs 102, the public-safety RAN 104, and the data network 106, as representative examples.

The depicted example communication system 100 includes communication links 112-126, any one or more of which could include one or more wireless-communication links and/or one or more wired-communication links. In FIG. 1, the communication links 112 and 114 are depicted with respective lightning-bolt graphics; while this graphic typically denotes wireless communication, and does in this example as well, this is not to the exclusion of one or more of the other communication links 116-126 being or including wireless-communication links.

The WCDs 110 may be any suitable computing and communication devices configured to engage in wireless communication with one or both of one or more of the RANs 102 over the air interface 112 as is known to those in the art and the public-safety RAN 104 over the air interface 114 as is known to those in the art. Some example WCDs 110 are discussed below in connection with the various figures.

As can be seen in FIG. 1, the communication link 112 (as mentioned above) connects the commercial RANs 102 and the WCDs 110, the communication link 114 (as mentioned above) connects the public-safety RAN 104 and the WCDs 110, the communication link 116 connects the commercial RANs 102 and the public-safety RAN 104, the communication link 118 connects the commercial RANs 102 and the data network 106, the communication link 120 connects the commercial RANs 102 and the circuit network 108, the communication link 122 connects the public-safety RAN 104 and the data network 106, the communication link 124 connects the data network and the circuit network 108, and the communication link 126 connects the public-safety RAN 104 and the circuit network 108. This arrangement is provided purely by way of example, as other arrangements could be implemented by those of skill in the relevant art in various different contexts.

FIG. 2 depicts a further example of aspects of the communication system of FIG. 1, in accordance with at least one embodiment. FIG. 2 depicts the communication system 100 of FIG. 1, though in more detail regarding some example WCDs 110 and an example RAN 102, although a similar figure could be depicted with an example implementation of the public-safety RAN 104 instead of an example RAN 102. As shown, FIG. 2 depicts an example RAN 102 as including an eNodeB (base station) 202, which communicates directly or indirectly with an evolved packet core (EPC) 204 over a communication link 206. As is the case with each of the links mentioned above, and as is the case with any of the links mentioned anywhere else in this disclosure, the communication link 206 may be or include one or more wireless-communication links and/or one or more wired-communication links, as deemed suitable by those of skill in the relevant art in a given context.

In at least one embodiment, the eNodeB 202 includes the hardware and software (and/or firmware) necessary for the eNodeB 202 to function as an eNodeB, a NodeB, a base station, a base transceiver station (BTS), a Wi-Fi access point, and/or the like, as known to those having skill in the relevant art. In some instances, the eNodeB 202 also includes functionality typically associated in the art with entities that are often referred to by terms such as BSCs, radio network controllers (RNCs), and the like. Also, while one eNodeB 202 is depicted by way of example in FIG. 2, any suitable number of eNodeBs could be deployed as deemed suitable by those of skill in the relevant art.

In general, the eNodeB 202 is an entity that, on one side (i.e., the wireless-network side (interface)), engages in wireless communications over the air interface 112 with one or more WCDs 110 according to a protocol such as LTE or the like and, on the other side (i.e., the "backhaul" side), engages in communications with the EPC 204 via the communication link 206, to facilitate communications between various WCDs 110 and networks such as the networks 104, 106, and 108.

The EPC 206 may include one or more network entities such as one or more mobility management entities (MMES), one or more serving gateways (SGWs), one or more packet data network (PDN) gateways (PDGs), one or more evolved packet data gateways (ePDGs), one or more home subscriber servers (HSSs), one or more access network discovery and selection functions (ANDSFs), and/or one or more other entities deemed suitable for a given implementation by those of skill in the relevant art. Moreover, these entities may be configured and interconnected in a manner known to those of skill in the relevant art to provide wireless service to the WCDs 110 via the eNodeB 202, and to bridge such wireless service with various transport networks. In general, a commercial RAN and a public-safely RAN may each provide wireless service according to a protocol such as LTE, Wi-Fi, APCO P25, TETRA, DMR, and/or the like. These examples are provided for illustration and not by way of limitation; moreover, those of skill in the art are aware of variations among different protocols and among different implementations of a given protocol, and of similarities across different protocols.

Figure 3:
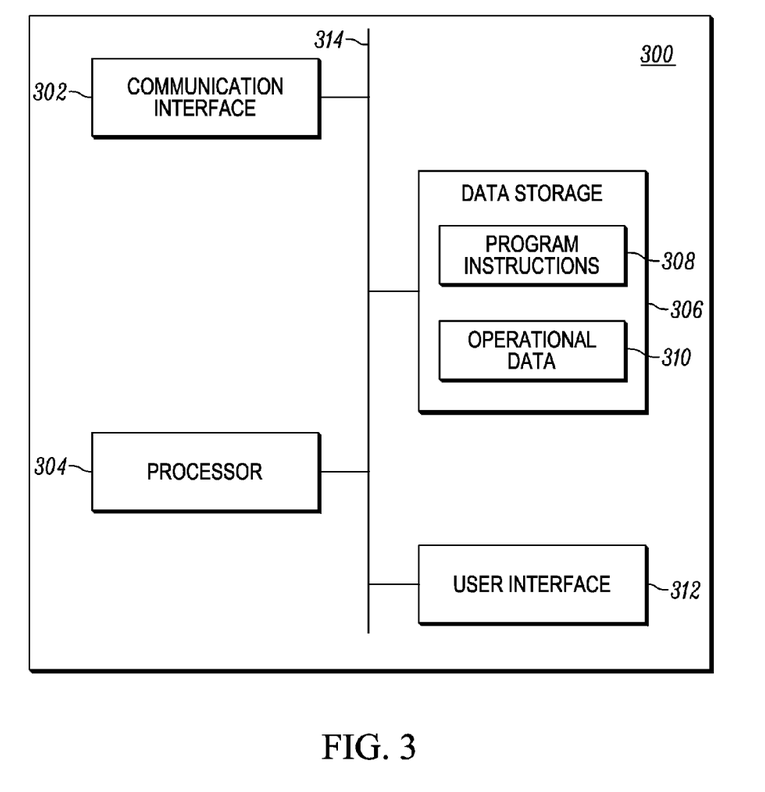
FIG. 3 depicts an example computing and communication device (CCD), in accordance with at least one embodiment.

FIG. 3 depicts an example computing and communication device (CCD), in accordance with at least one embodiment. In the embodiment that is depicted in FIG. 3, an example CCD 300 includes a communication interface 302, a processor 304, and data storage 306 containing instructions 308 executable by the processor 304 for causing the CCD 300 to carry out a set of functions, which may include those functions described below in connection with FIG. 4. As a general matter, the example CCD 300 is presented as an example system that could be programmed and configured to carry out the functions described herein.

The communication interface 302 may include one or more wireless-communication interfaces (for communicating according to, e.g., APCO P25, TETRA, DMR, LTE, Wi-Fi, Bluetooth, and/or one or more other wireless-communication protocols) and/or one or more wired-communication interfaces (for communicating according to, e.g., Ethernet, USB, and/or one or more other wired-communication protocols). As such, the communication interface 302 may include any necessary hardware (e.g., chipsets, antennas, Ethernet cards, etc.), any necessary firmware, and any necessary software for conducting one or more forms of communication with one or more other entities as described herein. The processor 304 may include one or more processors of any type deemed suitable by those of skill in the relevant art, some examples including a general-purpose microprocessor and a dedicated digital signal processor (DSP).

The data storage 306 may take the form of any non-transitory computer-readable medium or combination of such media, some examples including flash memory, read-only memory (ROM), and random-access memory (RAM) to name but a few, as any one or more types of non-transitory data-storage technology deemed suitable by those of skill in the relevant art could be used. As depicted in FIG. 3, the data storage 306 contains program instructions 308 executable by the processor 304 for carrying out various functions, and also contains operational data 310, which could include any one or more types of data stored and/or accessed by the example CCD 300 during operation. In embodiments in which a computing system such as the example CCD 300 is arranged, programmed, and configured to carry out processes such as the example process that is described below in connection with FIG. 4, the program instructions 308 are executable by the processor 304 for carrying out those functions; in instances where other entities described herein have a structure similar to that of the example CCD 300, the respective program instructions 308 for those respective devices are executable by their respective processors 304 to carry out functions respectively performed by those devices.

If present, the user interface 312 may include one or more input devices (a.k.a. components and the like) and/or one or more output devices (a.k.a. components and the like). With respect to input devices, the user interface 312 may include one or more touchscreens, buttons, switches, microphones, and the like. With respect to output devices, the user interface 312 may include one or more displays, speakers, light emitting diodes (LEDs), and the like. Moreover, one or more components (e.g., an interactive touchscreen-and-display component) of the user interface 312 could provide both user-input and user-output functionality. And certainly other user-interface components could be used in a given context, as known to those of skill in the art.

Figure 4:
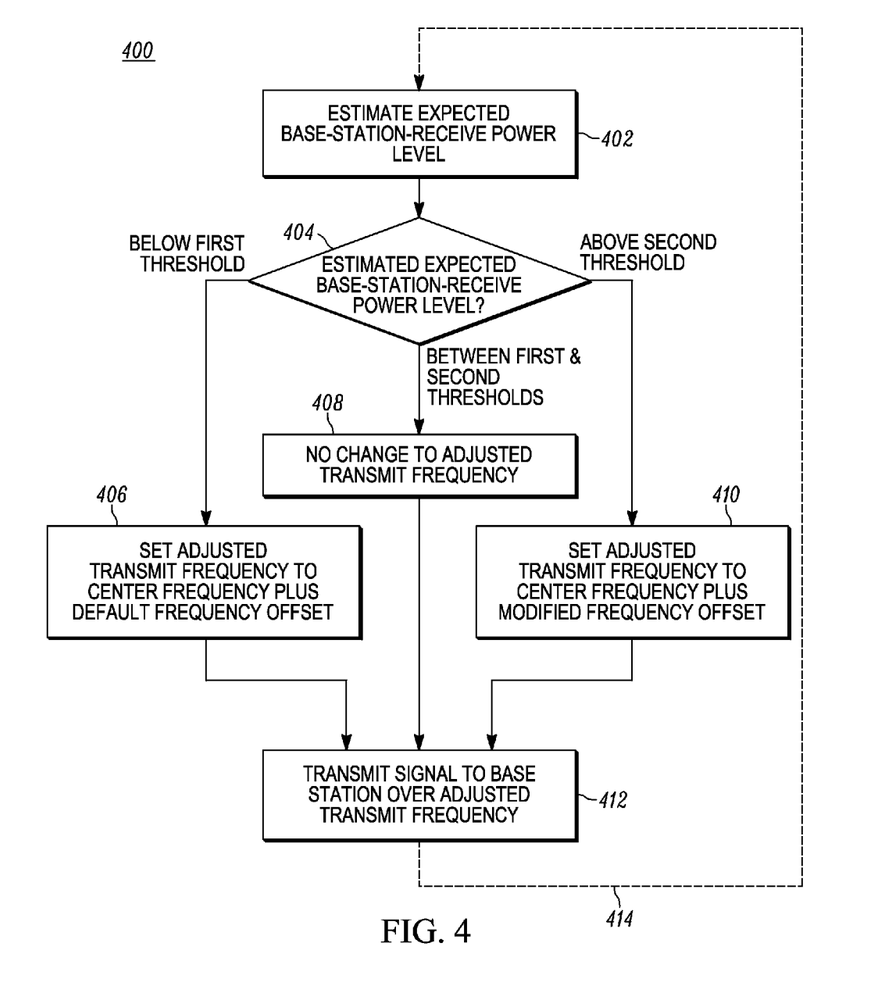
FIG. 4 depicts an example process, in accordance with at least one embodiment.

FIG. 4 depicts an example process, in accordance with at least one embodiment. In particular, FIG. 4 depicts an example process 400 that includes elements 402, 404, 406, 408, 410, 412, and 414. Although primarily depicted and described as being performed serially, at least a portion of the elements (steps) of the process 400 may be performed contemporaneously, or in a different order than is depicted in and described in connection with FIG. 4. Furthermore, in at least one embodiment, as is shown generally in FIG. 4 by the dashed arrow 414, the process 400 is repeated, at some point in time, after any of the elements 406-410 are completed. The process 400 is further described below.

In at least one embodiment, including the embodiment that is further described below in connection with FIG. 4, the process 400 is carried out by a mobile radio such as an example WCD 110. In general, the process 400 could be carried out by any radio (e.g., by any mobile radio, portable radio, two-way radio, LMR device, and/or other radio) or other communication device that is suitably equipped, programmed, and configured to carry out the process 400 (and/or one or more of the many variants of the process 400 discussed herein). At step 402, the mobile radio estimates an expected base-station-receive power level with respect to transmissions from the mobile radio to a base station. In some embodiments, the mobile radio does so without having yet made any such transmissions. In other embodiments, the mobile radio does so after having made at least one such transmission. In at least one embodiment, estimating the expected base-station-receive power level includes receiving an indication of the expected base-station-receive power level from the base station. In at least one such embodiment, that indication is a base-station-measured RSSI of an earlier uplink signal previously received by the base station from the mobile radio.

In at least one embodiment, the process 400 includes receiving a downlink signal from the base station and determining a mobile-radio-received power level of the received downlink signal. In at least one such embodiment, the mobile radio estimates the expected base-station-receive power level based at least in part on the determined mobile-radio-received power level of the received downlink signal. In at least one embodiment, the mobile radio determines the mobile-radio-received power level of the received downlink signal at least in part by measuring an RSSI of the received downlink signal. Moreover, it is noted that the term "mobile radio" as used herein could represent any portable or mobile user equipment (i.e., subscriber equipment).

In at least one embodiment, the mobile radio estimates the expected base-station-receive power level based at least in part on a comparative relationship between respective transmit powers of the base station and the mobile radio. For example, the base station may have a typical transmit power of ~100 Watts (W) and the mobile radio may have a typical transmit power of ~5 W; in such a context, considering those example numbers on a relative basis, the transmit power of the base station would be ~13 decibels (dB) greater than the transmit power of the mobile radio. In at least one embodiment, these respective transmit powers help the mobile radio to estimate the expected base-station-receive power level. In at least one embodiment, the mobile radio determines the mobile-radio-received power level of a received downlink signal and has knowledge of (i.e., data reflecting) typical transmit power levels of the base station and, using this information, the mobile radio can estimate certain properties of the air-interface channel filter, such as base-station-to-mobile-radio (e.g., downlink) path loss. The mobile radio can then apply these estimates when estimating the expected base-station-receive power level on the uplink.

The mobile radio may also have knowledge of not only the base station transmit power output ($TPO_{bs}$) level (in dBm), but also of the base station's transmit antenna system gain ($G_{TXbs}$ in dB), which can be utilized to compute the base station's effective isotropic radiated power (EIRP) level. Indeed, in at least one embodiment, subtracting the mobile-radio-received power level ($RSSI_m$ in dBm) of the received downlink signal from the base station's EIRP level (plus any mobile radio antenna system gain, $G_{TXmx}$ in dB), an estimate of downlink path loss ($PL_{DL}$ in dB) can be obtained. This is reflected in Equation 1 below:

$$PL_{DL} = TPO_{bs} + G_{TXbs} + G_{TXm} - RSSI_m \qquad (Eq.\ 1)$$

This $PL_{DL}$ value may be corrected based on a frequency difference between the downlink and uplink frequencies (as further described below); moreover, the mobile transmit power output level ($TPO_m$ in dBm) and antenna system gain ($G_{TXm}$ in dB) may also be taken into account when estimating the expected base-station-receive power level. Furthermore, it is noted that any number of base-station-transmitted (i.e., downlink) signals may be utilized to estimate the expected base-station-receive power level. Some examples of such signals include control-channel signals, signals transmitted on one or more traffic channels, and channel-grant signals, among many other examples that could be listed here. It is preferred that any one or more such downlink signals used in computing such estimates be recently received, so as to be more accurately representative of the current radio channel (e.g., in terms of path loss) than less recently received downlink signals would be.

In at least one embodiment, the mobile radio estimates the expected base-station-receive power level based at least in part on a comparative relationship between respective transmit frequencies of the base station and the mobile radio. For example, a correction term of the form:

$$N \log\left(\frac{f_{DL}}{f_{UL}}\right)$$

may be applied to a mobile-radio-measured RSSI of a downlink signal in order to better estimate the expected base-station-receive power level, where the downlink frequency ($f_{DL}$) is the transmit frequency of the base station, and where the uplink frequency ($f_{UL}$) is the transmit frequency of the mobile radio, and where N is a predetermined constant, such as 20 as an example. Thus, in at least one embodiment, the estimated expected base-station-received power level ($RSSI_{bs}$) (in dBm) is given by Equation 2 below:

$$RSSI_{bs} = TPO_m + G_{TXm} + G_{TXbs} - PL_{DL} + N\log\left(\frac{f_{DL}}{f_{UL}}\right) \quad \text{(Eq. 2)}$$

In at least one embodiment, the mobile radio estimates the expected base-station-receive power level based at least in part on a comparative relationship between respective locations of the base station and the mobile radio. In at least one such embodiment, one or both of the location of the base station and the location of the mobile radio is determined using one or more of a satellite-based geo-positioning system (e.g., GPS, GLONASS, Galileo Positioning System, Beidou Navigation System, and the like) a wireless-network infrastructure user-equipment-location prediction, and an active Wi-Fi connection and a list of in-range Wi-Fi signals.

At step 404, the mobile radio determines whether the estimated expected base-station-receive power level is below a first threshold, above a second threshold, or between the first threshold and the second threshold. Each threshold may correspond with a power level (e.g., an RSSI value). Step 404 may be carried out in various different ways, including first comparing the estimated expected base-station-receive power level to one of the two thresholds and then the other, comparing the estimated expected base-station-receive power level to one of the two thresholds and then, if necessary, comparing the estimated expected base-station-receive power level to the other threshold, and so on.

If the mobile radio determines at step 404 that the estimated expected base-station-receive power level is below the first threshold, then at step 406, the mobile radio adjusts its transmit frequency (e.g., a transmit frequency of a communication interface (e.g. the communication interface 302 of the CCD 300 of FIG. 3)) to be the center frequency of a radio channel (e.g., a shared 25-kHz-wide radio channel) plus a default frequency offset.

If the mobile radio determines at step 404 that the estimated expected base-station-receive power level is between the first threshold and the second threshold, then the mobile radio responsively carries out step 408, which is discussed below in the context of several example embodiments.

In at least one embodiment, the first threshold is less than the second threshold. In one such example scenario, the estimated expected base-station-receive power level begins below the first threshold and increases to become greater than the first threshold but not greater than the second threshold; in such an example scenario, no change is made to the adjustable transmit frequency. In a second example scenario, the estimated expected base-station-receive power level begins above the second threshold and decreases to become less than the second threshold but not less than the first threshold; in that example second scenario, no change is made to the adjustable transmit frequency. This paradigm allows for a hysteresis-like effect with regard to the sensitivity of the dependence of the value of the adjustable transmit frequency to changes in the estimated expected base-station-receive power level. The use of two different threshold values allows for the avoidance of "ping-ponging" (i.e., the transmit frequency rapidly switching between (i) the center frequency plus the default offset and (ii) the center frequency plus the modified offset), which could occur as a result of the estimated expected base-station-receive power level fluctuating above and below a single threshold. Some examples of the first and second thresholds for a P25 LMR system are −70 dBm and −58 dBm (respectively), though certainly other values could be used as deemed suitable by those having skill in the relevant art in different contexts.

In at least one embodiment, the first threshold is equal to the second threshold. In such an embodiment, transmit-frequency "ping ponging" is an unwanted yet possible characteristic of the systems and methods described herein. In such an embodiment, the step 410 will not be carried out, as it is impossible for the estimated expected base-station-receive power level to be between the first threshold and the second threshold.

If the mobile radio determines at step 404 that the estimated expected base-station-receive power level is above the second threshold, then at step 410, the mobile radio adjusts its transmit frequency to be the center frequency of a radio channel (e.g., a shared 25-kHz-wide radio channel) plus a modified frequency offset, where the modified frequency offset is greater in magnitude than the default frequency offset.

In at least one embodiment, the process 400 includes selecting the magnitude of the modified frequency offset based at least in part the estimated expected base-station-receive power level. In at least one such embodiment, the selected magnitude of the modified frequency offset is one of two predetermined values, each of which corresponds to a respective range of estimated expected base-station-receive power levels, where each such range exclusively includes estimated expected base-station-receive power levels that are greater than the second threshold.

In at least one embodiment, the mobile radio, such as the CCD 300 of FIG. 3, includes a user interface, such as the user interface 312 of the CCD 300 of FIG. 3, and the process 400 includes receiving, via the user interface, one or both of the magnitude of the default frequency offset and a signum of the default frequency offset.

In at least one embodiment, the process 400 further includes receiving, from the base station, one or both of the magnitude of the default frequency offset and a signum of the default frequency offset. In at least one such embodiment, receiving from the base station comprises receiving via a control channel.

In an embodiment, if the estimated expected base-station-receive power level exceeds the second threshold (e.g., −58dBm), it is anticipated that uplink signals transmitted by the mobile radio to the base station will be strong (as received at the base-station input), and the mobile radio accordingly uses the modified frequency offset as opposed to the default frequency offset in selecting its transmit channel. In at least one embodiment, if the lower carrier allocation (i.e., less than the center frequency) in the shared channel allocation is utilized, an additional offset amount (e.g., of approximately 1.4 kHz) is subtracted from the default frequency offset (i.e., the modified frequency offset is positioned further from the center frequency of the shared channel by that additional offset amount). If, on the other hand, the upper carrier allocation (i.e., greater than the center frequency) in the shared channel allocation is utilized, an additional 1.4 kHz (again, as an example) is added to the default frequency offset. This additional frequency separation provides additional adjacent channel isolation, due at least in part to the roll-off of the channel filtering in the base receiver.

Each of the steps 406, 408, and 410 lead to the step 412, at which the mobile radio transmits an uplink signal to the base station over the (potentially) adjusted transmit frequency. In at least one embodiment, transmitting the uplink signal comprises transmitting the uplink signal via a communication interface, such as the communication interface 302 of the CCD 300 of FIG. 3.

Among the advantageous aspects of the present systems and methods is that adjacent channel interference is addressed by the subscriber unit (e.g., the mobile or portable radio) alone. In at least one embodiment, transmitting an uplink signal to a base station includes transmitting the uplink signal to a base station that can tolerate an additional frequency offset, as many production base station receivers can today. Thus, in at least one embodiment, without the need for explicit signaling between the mobile radio and the base station regarding the precise transmit frequency being used (or about to be used) by the mobile radio, the mobile radio adjusts its own transmit frequency in accordance with the present methods and systems, and the base station is flexible enough to still successfully receive and decode the uplink signal.

In at least one embodiment, the mobile radio further includes a reference oscillator. If the stability of the reference oscillator in the mobile radio is maintained at a relatively high level, or if the mobile radio is locked to a known reference (as is the case when a subscriber device is locked to a base station and its reference—often GPS, a precision TCXO, or Rubidium-based standards), the mobile radio can further offset itself from the channel frequency to provide additional reduction of adjacent channel interference and the alleviation of the need for uplink power control.

The current Telecommunications Industry Association (TIA) adjacent-channel-interference tolerance specification for P25 systems is 60dB. Furthermore, demonstrations have been made of working multi-carrier P25 receiver designs that perform in excess of 65 dB adjacent-channel-interference-tolerance levels. Using the present systems and methods, an extension of an existing 65 dB+adjacent-channel-performance level to a level in excess of 75 dB is possible. Implementation of the present systems and methods can substantially reduce, or even eliminate, the need for uplink power control, thereby allowing a subscriber device to continue to operate with, at most, one small power step, thus maintaining overall PA efficiency.

Moreover, in at least one embodiment, the process 400 is (e.g., periodically) repeated (e.g., for each uplink transmission), as shown by the dashed (indicating optional) arrow 414; in at least one such embodiment, one or more previous estimates of the expected base-station-receive power level (e.g., from a previous (e.g., most recent) uplink-signal transmission and/or iteration of the process 400) may be utilized by the mobile radio. As one example, the mobile radio could use a previous estimate as its current estimate in its current iteration of the process 400. As another example, the mobile radio could perform calculations involving one or more previous estimates, perhaps in conjunction with a current estimate, to arrive at an estimated expected base-station-receive power level for its current iteration of the process 400. And certainly numerous other possible example implementations could be listed here.

Figure 5:
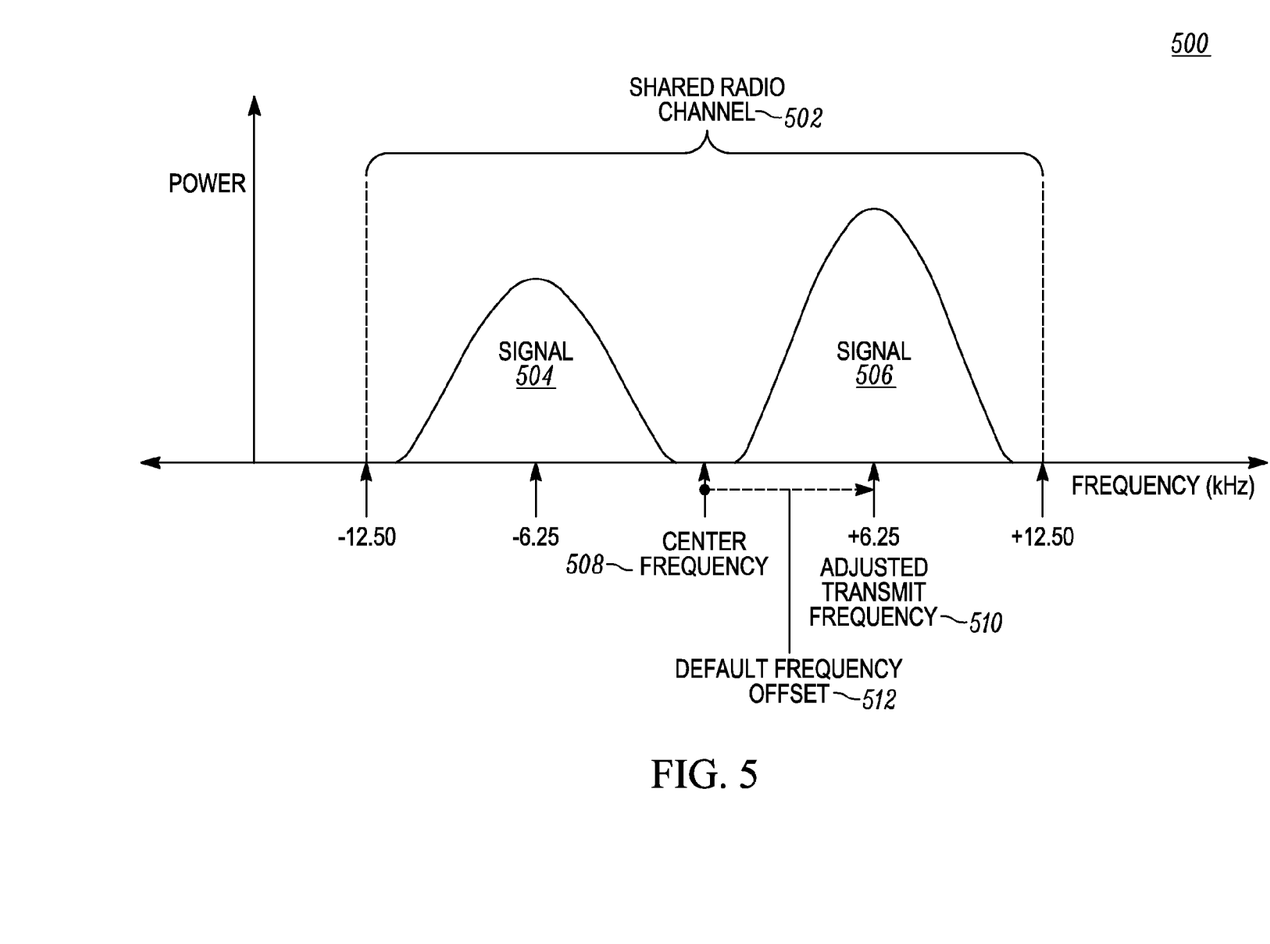
FIG. 5 depicts a shared radio channel in an initial state, in accordance with at least one embodiment.
Figure 6:
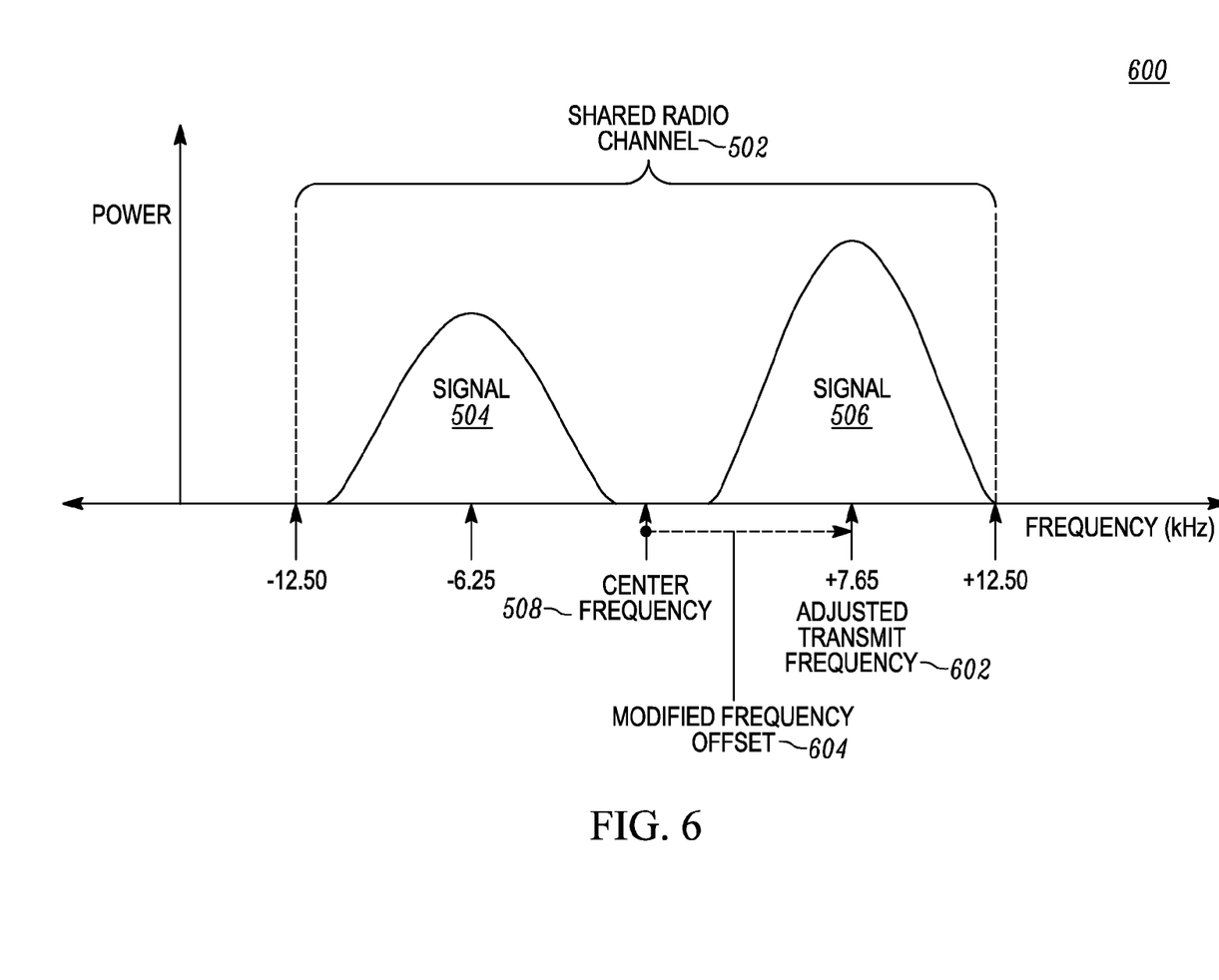
FIG. 6 depicts the shared channel of FIG. 5 in a subsequent state, in accordance with at least one embodiment.

The next portion of this disclosure includes descriptions of FIGS. 5 and 6, each of which depicts a shared radio channel containing two signals. FIG. 5 depicts a scenario in which the estimated expected base-station-receive power level is below the first threshold, while FIG. 6 depicts a scenario in which the estimated expected base-station-receive power level is above the second threshold.

FIG. 5 depicts a shared radio channel in an initial state, in accordance with at least one embodiment. In particular, FIG. 5 depicts an example scenario 500 that includes a shared radio channel 502 that has a center frequency 508. The shared radio channel 502 includes two distinct communication sub-channels. One sub-channel carries a signal 504. The other sub-channel carries a signal 506. Each sub-channel is an independent communication channel that can carry unique information. In this manner, a single radio resource (i.e., channel) may be utilized to carry two distinct signal transmissions, thereby increasing spectral efficiency.

In the example that is depicted in and described in connection with FIGS. 5 and 6, the process 400 of FIG. 4 would be carried out with respect to the signal 506. The left sub-channel (which carries the signal 504) of the shared radio channel 502 is present to help establish an operational context. The signal 506 has (i.e., is centered at) an adjusted transmit frequency 510 that is 6.25 kHz greater than the center frequency 508 of the shared radio channel 502 (which, in this example, is a 25-kHz-wide shared radio channel). In the parlance of this disclosure, that 6.25 kHz is an example of a default frequency offset (512). Similarly, the signal 504 as an adjusted transmit frequency that is 6.25 kHz less than the center frequency 508 of the shared radio channel 502. In general, FIG. 5 depicts a scenario in which the estimated expected base-station-receive power level is below the first threshold. In at least one embodiment, the value of the magnitude of the default frequency offset is an engineering and design parameter that is selected based at least in part on the occupied modulation bandwidth of each signal (i.e., the signals 504 and 506 in this example).

In at least one embodiment, including the embodiment that is depicted in and described in connection with FIGS. 5 and 6, the shared radio channel 502 is a 25-kHz-wide channel. Recent regulatory changes allow multiple independent carriers (a.k.a. channels, sub-channels, and by other terms) that are modulated according to certain modulation methods to occupy a single licensed 25-kHz-wide channel without exceeding first-adjacent-channel-emissions regulations and requirements. In some of the examples and embodiments that are described herein, two signals (i.e., the signals 504 and 506) share a single radio channel 502 by being offset in different directions from the center frequency 508 of that shared radio channel 502; this is by way of example, as numbers of signals other than two could share a radio channel.

Moreover, it is also contemplated that two-signal shared channels similar to the example shared channel 502 could include two different sub-channels with two different respective default frequency offsets and/or modified frequency offsets. Indeed, the present disclosure can be extended to contexts involving any number of sub-channels per shared channel, any number of adjacent channels, and any number of possible frequency offsets (and corresponding threshold levels of estimated expected base-station-receive power levels) for one or more such sub-channels or channels. Moreover, it is noted that shared channels may also be termed split, bifurcated, packed, or aggregated channels, among other possible terms.

The various numbers (−12.50, −6.25, +6.25, and +12.50) along the frequency (kHz) axis are not meant to represent absolute, actual values of frequencies themselves, but rather represent frequency offsets relative to the center frequency 508. To clarify, the signal 504, which is shown centered at −6.25, has a characteristic frequency that is the center frequency 508 minus 6.25 kHz. In at least one embodiment, wherein the shared radio channel is a 25-kHz-wide channel, the default frequency offset has a magnitude of 6.25 kHz (as depicted in FIG. 5). The magnitude of a frequency offset makes no reference to a signum of the offset. In other words, a frequency offset with a magnitude of 10 kHz describes the possibility of the offset being +10 kHz and −10 kHz. And certainly frequency-offset magnitudes other than 6.25, 10, and the other examples presented in this disclosure could be used as deemed suitable by those of skill in the relevant art for a given implementation or in a given context.

FIG. 6 depicts the shared channel of FIG. 5 in a subsequent state, in accordance with at least one embodiment. In particular, FIG. 6 depicts an example scenario 600 that occurs later in time than the example scenario 500 that is depicted in FIG. 5. The example scenario 600 of FIG. 6 corresponds with the mobile radio (that is transmitting or has transmitted the signal 506) having determined that the estimated expected base-station-receive power level exceeds the second threshold; the mobile radio has accordingly responsively set its adjusted transmit frequency 602 to be equal to the center frequency 508 plus a modified frequency offset 604. In the depicted example, the modified frequency offset is 7.65 kHz, which exceeds the example default frequency offset of 6.25 kHz by 1.4 kHz. Of course, all of these values are presented by way of illustration and not limitation.

It can be seen that, in the depicted embodiment, the default frequency offset 512 and the modified frequency offset 604 have values that either are both positive or are both negative, and the modified frequency offset 604 has a magnitude that exceeds the magnitude of the default frequency offset 512. Taken together, the result is that an adjusted transmit channel that is based on the modified frequency offset is further from the center frequency 508 of the shared channel 502 than is an adjusted transmit channel that is based on the default frequency offset.

Since mobile-radio transmissions (by different mobile radios) to a given base station are rarely co-located (in fact, they are typically widely distributed within a coverage area), large received signal dynamic ranges and adjacent channel interference may be present at a base-station receiver. Base-station-received signal levels may be detected by the base station with up to, e.g., roughly 80 dB difference at the base-station-receiver input, due to near-far transmissions of varying power levels and channel effects (exceeding the typical 60-65 dB adjacent-channel-interference receiver tolerance levels).

Among other advantages, the present systems and methods mitigate such issues at least in part by the "near" transmitter determining that its transmissions are being (or are likely to be) received by the base station at a high power level, and responsively shifting its transmit frequency away from the frequency on which the "far" transmitter is (or might be) transmitting. It is explicitly noted that, while the depicted and described embodiments show a signal (e.g., the signal 504) being transmitted by a "far" transmitter, this is for illustration and not by way of limitation, as it is not necessary that this other signal be actually present; in some ways, the present systems and methods can be seen as preventively avoiding or at least mitigating near-far interference that could be occurring (or that is at least likely to occur) due to a far-transmitter signal that might be present, or might occasionally or intermittently be present, or the like. Moreover, it is noted that, in some instances, the transmitter that is characterized herein as being the "far" transmitter may actually be relatively close to the base station (and perhaps even close than the "near" transmitter), but may be shadowed due to, e.g., building propagation losses.

Figure 7:
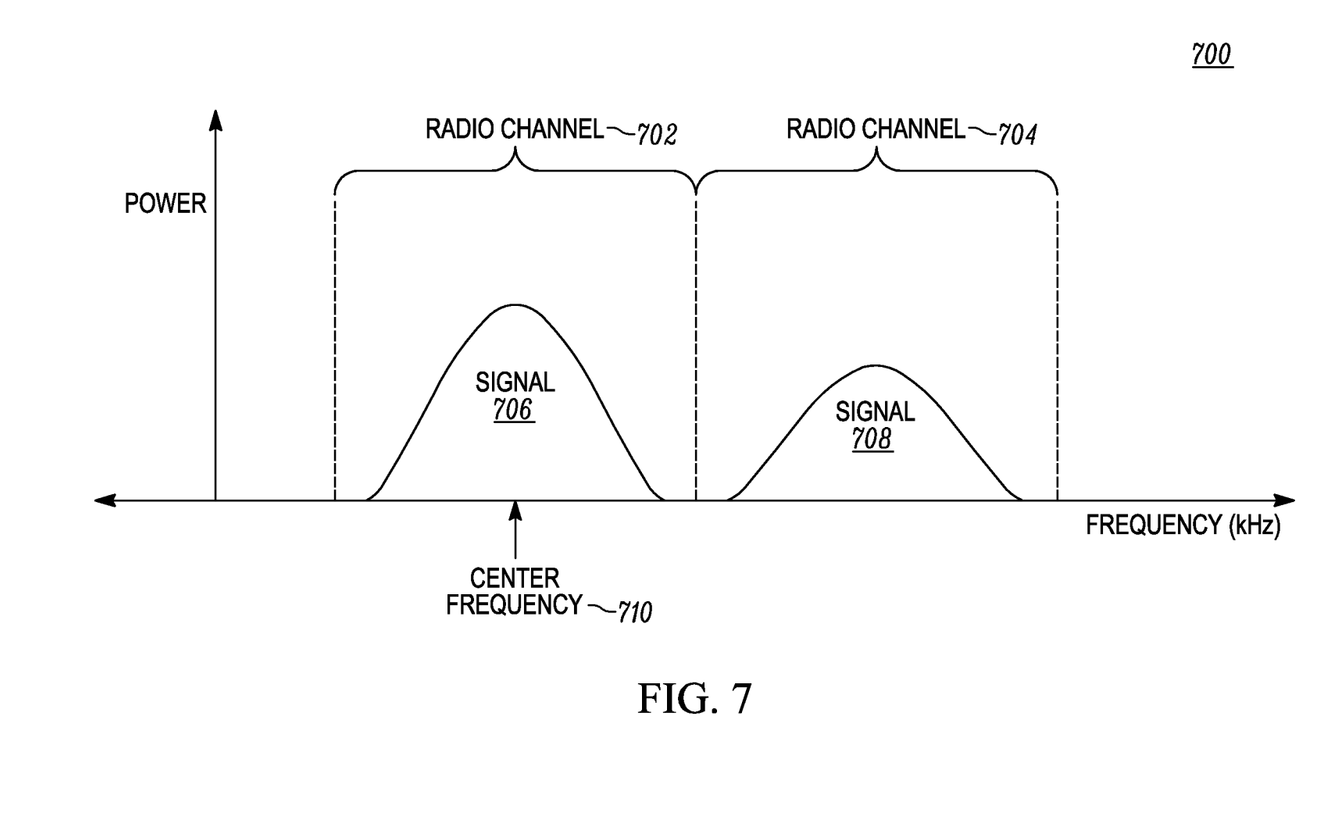
FIG. 7 depicts two adjacent channels in an initial state, in accordance with at least one embodiment.

In the embodiments described above, the "near" transmitter and the "far" transmitter share a radio channel: each has been allocated a different sub-channel within that shared channel. In other embodiments, such as the embodiment that is described below in connection with FIGS. 7 and 8, the "near" transmitter and the "far" transmitter have been allocated adjacent transmit channels (as opposed to adjacent sub-channels within a shared channel). FIG. 7 depicts a scenario in which the estimated expected base-station-receive power level is below the first threshold, while FIG. 8 depicts a scenario in which the estimated expected base-station-receive power level is above the second threshold.

FIG. 7 depicts two adjacent channels in an initial state, in accordance with at least one embodiment. In connection with FIG. 7, as is the case with FIG. 5, the term "initial" simply refers to a state that is earlier in time than a subsequent state that is described in connection with FIG. 8 (or that is described in connection with FIG. 6, in the case of FIG. 5). FIG. 7 depicts an example scenario 700 involving a radio channel 702 and an adjacent radio channel 704. The radio channel 702 carries a signal 706. The radio channel 704 carries a signal 708. Each radio channel is an independent communication channel that can carry unique information. In the example that is depicted in and described in connection with FIGS. 7 and 8, the method 400 of FIG. 4 would be carried out with respect to the signal 706. The radio channel 702 has a center frequency 710 at which the signal 706 is also centered. Thus, in the embodiment that is depicted in and described in connection with FIGS. 7 and 8, the default frequency offset has a magnitude of zero. In FIG. 7, the estimated expected base-station-receive power level is below the first threshold.

Figure 8:
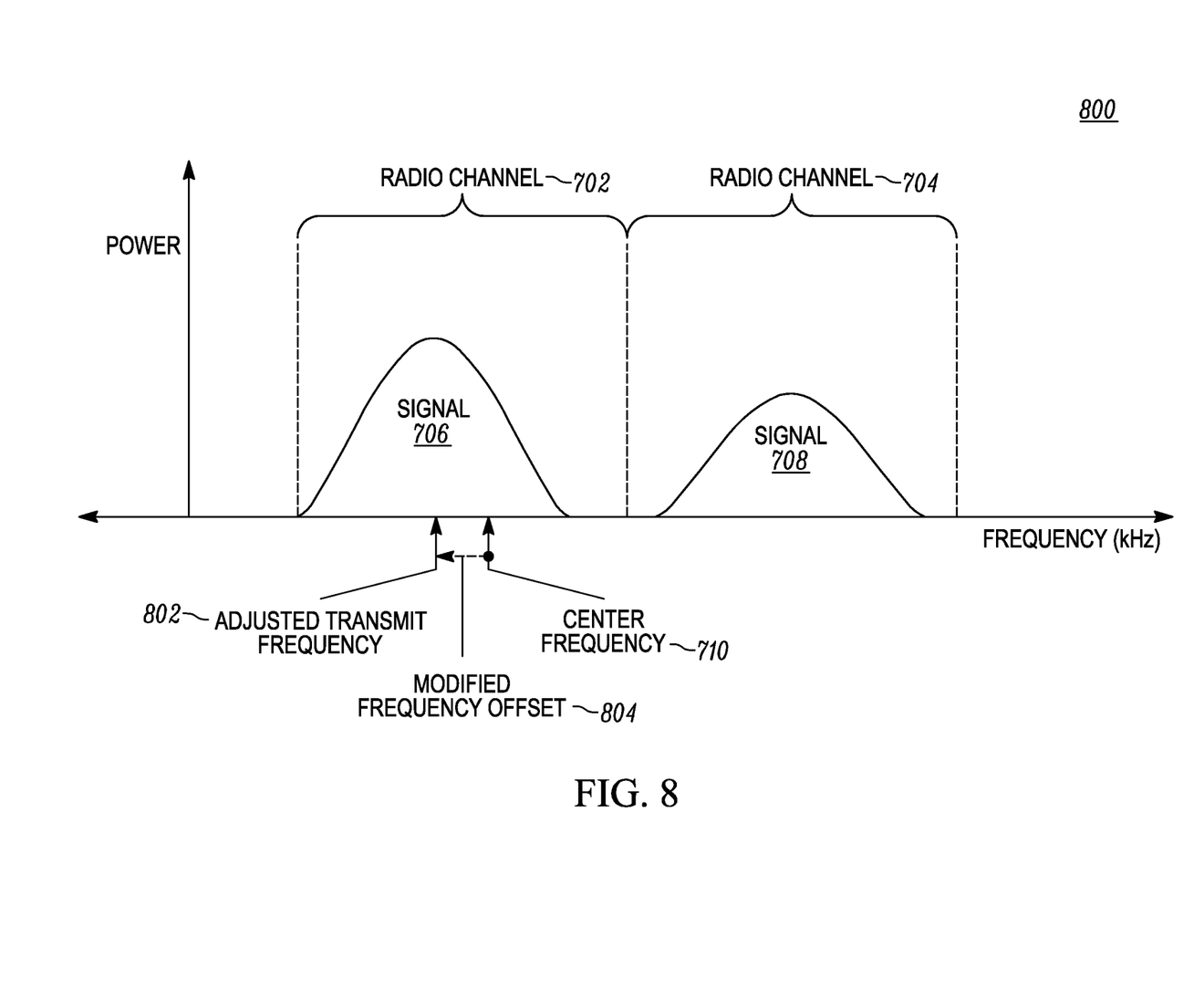
FIG. 8 depicts the two adjacent channels of FIG. 7 in a subsequent state, in accordance with at least one embodiment.

FIG. 8 depicts the two adjacent channels of FIG. 7 in a subsequent state, in accordance with at least one embodiment. In particular, FIG. 8 depicts an example scenario 800 that occurs later in time than the example scenario 700 that is depicted in FIG. 7. The example scenario 800 of FIG. 8 corresponds with the mobile radio (that is transmitting or has transmitted the signal 706 in the channel 702) having determined that the estimated expected base-station-receive power level exceeds the second threshold; the mobile radio has accordingly responsively set its adjusted transmit frequency 802 to be equal to the center frequency 710 plus a modified frequency offset 804. In the depicted example, the modified frequency offset 804 is a negative number.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing," or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element preceded by "comprises . . . a," "has . . . a," "includes . . . a," "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about," or any other version thereof, are defined as being close to as understood by one of ordinary skill in the art, and in one non-limiting embodiment the term is defined to be within 1%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A method carried out by a mobile radio that is configured to use an adjustable transmit frequency, the method comprising:
   estimating an expected base-station-receive power level with respect to transmissions from the mobile radio to a base station;
   adjusting the transmit frequency to be a center frequency of a radio channel plus a default frequency offset responsive to the estimated expected base-station-receive power level being less than a first threshold;
   adjusting the transmit frequency to be the center frequency plus a modified frequency offset responsive to the estimated expected base-station-receive power level being greater than a second threshold, the modified frequency offset being greater in magnitude than the default frequency offset; and
   transmitting an uplink signal to the base station over the adjusted transmit frequency;
   including an indication of an expected base-station-receive power level from the base station,
   wherein the indication of the expected base-station-receive power level is a base-station-measured received signal strength indicator (RSSI) of an earlier uplink signal previously received by the base station from the mobile radio.

2. The method of claim 1, wherein the radio channel is a shared radio channel.

3. The method of claim 2, wherein the shared radio channel is a 25-kHz- wide channel.

4. The method of claim 3, wherein the default frequency offset has a magnitude of 6.25 kHz.

5. The method of claim 1, wherein the default frequency offset has a magnitude of zero.

6. The method of claim 1, wherein the modified frequency offset has a magnitude that exceeds the magnitude of the default frequency offset by 1.4 kHz.

7. The method of claim 1, further comprising selecting the magnitude of the modified frequency offset based at least in part on the estimated expected base-station-recieve power level.

8. The method of claim 1, wherein the mobile radio comprises a user interface, the method further comprising receiving, via the user interface, one or both of the magnitude of the default frequency offset and a signum of the default frequency offset.

9. The method of claim 1, further comprising receiving, from the base station, one or both of the magnitude of the default frequency offset and a signum of the default frequency offset.

10. The method of claim 9, wherein receiving from the base station comprises receiving via a control channel.

11. The method of claim 1, wherein the default frequency offset and the modified frequency offset have values that are either both positive or both negative.

12. The method of claim 1, further comprising:
    receiving a downlink signal from the base station; and
    determining a mobile-radio-received power level of the received downlink signal,
    wherein the mobile radio estimates the expected base-station-receive power level based at least in part on the determined mobile-radio-received power level of the received downlink signal.

13. The method of claim 12, wherein the mobile radio determines the mobile-radio-received power level of the received downlink signal at least in part by measuring a received signal strength indicator (RSSI) of the received downlink signal.

14. The method of claim 1, wherein the mobile radio estimates the expected base-station-receive power level based at least in part on a comparative relationship between respective transmit powers of the base station and the mobile radio.

15. The method of claim 1, wherein the mobile radio estimates the expected base-station-receive power level based at least in part on a comparative relationship between respective transmit frequencies of the base station and the mobile radio.

16. The method of claim 1, wherein the mobile radio estimates the expected base-station-receive power level based at least in part on a comparative relationship between respective locations of the base station and the mobile radio.

17. The method of claim 16, wherein one or both of the location of the base station and the location of the mobile radio is determined using one or more of a satellite-based geo-positioning system, a wireless-network infrastructure user-equipment-location prediction, and an active Wi-Fi connection and a list of in-range Wi-Fi signals.

18. A mobile radio that is configured to use an adjustable transmit frequency that is offset from a center frequency of a radio channel, the mobile radio comprising:
   a communication interface;
   a processor; and
      data storage containing instructions executable by the processor for causing the system to carry out a set of functions, the set of functions including: estimating an expected base-station-receive power level with respect to transmissions from the mobile radio to a base station;
   adjusting the transmit frequency of the communication interface to be the center frequency plus a default frequency offset responsive to the estimated expected base-station-receive power level being less than a first threshold;
   adjusting the transmit frequency of the communication interface to be the center frequency plus a modified frequency offset responsive to the estimated expected base-station-receive power level being greater than a second threshold, the modified frequency offset being greater in magnitude than the default frequency offset; and
   transmitting, via the communication interface, an uplink signal to the base station over the adjusted transmit frequency including an indication of an expected base-station-receive power level from the base station,
   wherein the indication of the expected base-station-receive power level is a base-station-measured received signal strength indicator (RSSI) of an earlier uplink signal previously received by the base station from the mobile radio.

* * * * *